United States Patent
Cheng et al.

(10) Patent No.: US 8,815,694 B2
(45) Date of Patent: Aug. 26, 2014

(54) INDUCING CHANNEL STRESS IN SEMICONDUCTOR-ON-INSULATOR DEVICES BY BASE SUBSTRATE OXIDATION

(71) Applicant: International Business Machines Corporation, Armonk, NY (US)

(72) Inventors: Kangguo Cheng, Schenectady, NY (US); Bruce B. Doris, Brewster, NY (US); Balasubramanian S. Haran, Mount Kisco, NY (US); Ali Khakifirooz, Mountain View, CA (US); Pranita Kerber, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/692,069

(22) Filed: Dec. 3, 2012

(65) Prior Publication Data

US 2014/0151803 A1    Jun. 5, 2014

(51) Int. Cl.
*H01L 21/331* (2006.01)
*H01L 21/8222* (2006.01)

(52) U.S. Cl.
USPC ........... 438/311; 438/249; 438/270; 438/439; 438/700; 438/769; 257/E21.006; 257/E21.027; 257/E21.042; 257/E21.051; 257/E21.058; 257/E21.126; 257/E21.127; 257/E21.32; 257/E21.4; 257/E21.17; 257/E21.217; 257/E21.218; 257/E21.229; 257/E21.304; 257/E21.267; 257/E21.545; 257/E21.546

(58) Field of Classification Search
USPC ......... 438/311, 241, 249, 258, 266, 501, 505, 438/524, 439, 602, 603, 604, 680, 692, 270, 438/700, 706, 712, 745, 769; 257/E21.006, 257/E21.027, E21.042, E21.051, E21.058, 257/E21.126, E21.127, E21.17, E21.217, 257/E21.218, E21.229, E21.304, E21.267, 257/E21.32, E21.4, E21.545, E21.546

See application file for complete search history.

(56) References Cited

U.S. PATENT DOCUMENTS

| 7,585,711 | B2* | 9/2009 | Chen et al. .................... 438/154 |
| 7,700,416 | B1* | 4/2010 | Clifton et al. ................. 438/142 |
| 7,884,004 | B2 | 2/2011 | Bangsaruntip et al. |
| 2010/0193770 | A1 | 8/2010 | Bangsaruntip et al. |
| 2011/0108804 | A1 | 5/2011 | Bangsaruntip et al. |
| 2011/0108943 | A1 | 5/2011 | Dennard et al. |
| 2011/0254090 | A1 | 10/2011 | Cheng et al. |
| 2012/0104498 | A1* | 5/2012 | Majumdar et al. ............ 257/351 |

* cited by examiner

*Primary Examiner* — David Nhu
(74) *Attorney, Agent, or Firm* — Daniel Schnurmann; Steven M. Kellner

(57) ABSTRACT

Embodiments include semiconductor-on-insulator (SOI) substrates having SOI layers strained by oxidation of the base substrate layer and methods of forming the same. The method may include forming a strained channel region in a semiconductor-on-insulator (SOI) substrate including a buried insulator (BOX) layer above a base substrate layer and a SOI layer above the BOX layer by first etching the SOI layer and the BOX layer to form a first isolation recess region and a second isolation recess region. A portion of the SOI layer between the first isolation recess region and the second isolation recess region defines a channel region in the SOI layer. A portion of the base substrate layer below the first isolation recess region and below the second isolation recess region may then be oxidized to form a first oxide region and a second oxide region, respectively, that apply compressive strain to the channel region.

10 Claims, 15 Drawing Sheets

INDUCING CHANNEL STRESS IN SEMICONDUCTOR-ON-INSULATOR DEVICES BY BASE SUBSTRATE OXIDATION

FIELD OF THE INVENTION

The present invention relates generally to fabricating extremely-thin semiconductor-on-insulator (ETSOI) semiconductor devices, and more specifically to inducing channel stress in ETSOI field effect transistors (FETs).

BACKGROUND

Metal-oxide-semiconductor (MOS) technology is a commonly-used technology for fabricating field effect transistors (FETs) as part of advanced integrated circuits, such as CPUs, memory, and storage devices, and the like. In MOS technology, a FET may be formed by depositing a gate structure over a channel region connecting a source and a drain. In order to improve device performance, particularly to reduce parasitic device capacitance, FETs may be fabricated on a semiconductor-on-insulator (SOI) substrate. An SOI substrate may contain a base substrate layer, a buried insulator (BOX) layer above the base substrate layer, and a top semiconductor layer above the BOX layer. FETs formed on an SOI substrate have channel regions formed in the top semiconductor layer of the SOI substrate. Further, FETs formed on extremely-thin SOI (ETSOI) substrates (i.e., SOI substrates with top semiconductor layers having a thickness of generally less than approximately 20 nm) may further benefit from superior short channel control and device matching.

As FETs continue to become smaller in size, carrier mobility in the channel region may also be reduced due in part to increased dopant concentration and, therefore channel strain may be necessary to achieve desired device performance. However, it may be difficult to apply compressive strain to the channel region of pFETs (i.e., FETs with p-type doped channel regions) formed on ETSOI substrates due to the relative thinness of the top semiconductor layers of the ETSOI substrates. Commonly used compressive strain techniques, such as stress liners and embedded silicon-germanium source/drain regions may prove ineffective when applied to ETSOI pFETs. Therefore, a new method of applying compressive stress to ETSOI pFETs may be desirable.

SUMMARY

The present invention relates to semiconductor-on-insulator substrates with strained SOI layers and methods of forming the same. According to one exemplary embodiment, a strained channel region may be formed in a semiconductor-on-insulator substrate (SOI) including a buried insulator (BOX) layer above a base substrate layer and a SOI layer above the BOX layer. The SOI substrate may include an extremely-thin SOI layer having a thickness of approximately 3 nm to approximately 20 nm. The strained channel region may be formed by first etching the SOI layer and the BOX layer to form a first recess region and a second recess region. A portion of the SOI layer between the first recess region and the second recess region may define a channel region have a first end adjacent to the first recess region and a second end adjacent to the second recess region. The base substrate below the first recess region and the second recess region may be oxidized to form a first oxide region in the first recess region and a second oxide region in the second recess region. The first oxide recess region and the second oxide recess region may apply compressive strain to the channel region Another embodiment of the invention includes a strained SOI substrate including a base substrate; a BOX above the base substrate; and a strained semiconductor channel above the BOX. The strained SOI substrate may further include a first oxide region partially within the base substrate adjacent to a first end of the strained semiconductor channel layer, a second oxide region partially within the base substrate adjacent to a second end of the strained semiconductor channel layer, a first isolation structure above the first oxide region, and a second isolation structure above the second oxide region.

Another embodiment of the invention includes a semiconductor device including a BOX layer above a base substrate, a SOI layer above the BOX layer; a first p-type field effect transistor (pFET) on the SOI layer, a second pFET on the SOI layer, and a first isolation structure between the first pFET and the second pFET. The first isolation structure may include an oxide region partially within the base substrate and an insulating region above the oxide region The oxide region may apply compressive strain to the semiconductor-on-insulator layer between the first field effect transistor and the second field effect transistor.

Figure 1:
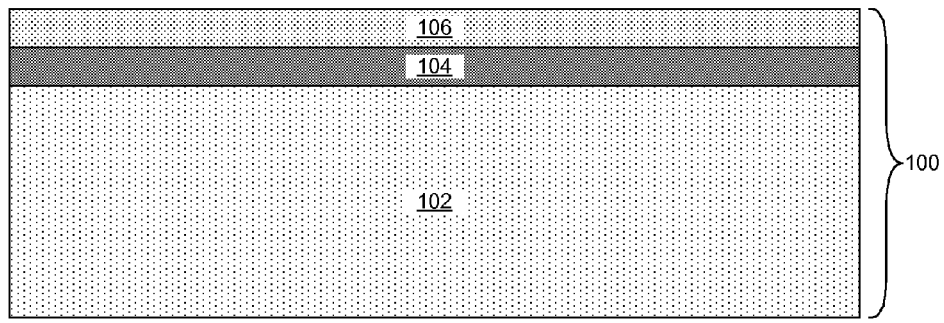
FIG. 1 depicts an extremely-thin semiconductor-on-insulator (ETSOI) substrate, according to an embodiment of the present invention.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Referring to FIG. 1, an extremely-thin semiconductor-on-insulator (ETSOI) substrate 100 may be provided. The substrate 100 may include a base substrate 102, a buried insulator (BOX) layer 104, and a semiconductor-on-insulator (SOI) layer 106. The base substrate 102 may be made from any of several known semiconductor materials including, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. Typically the base substrate 102 may be approximately, but is not limited to, several hundred microns thick. For example, the base substrate 102 may include a thickness ranging from approximately 0.5 mm to approximately 1.5 mm.

The BOX layer 104 may be formed from any of several known insulator materials. Non-limiting examples include, for example, oxides, nitrides and oxynitrides of silicon. Oxides, nitrides and oxynitrides of other elements are also envisioned. In addition, the BOX layer 104 may include crystalline or non-crystalline insulator material. Moreover, the BOX layer 104 may be formed using any of several known methods. Non-limiting examples include ion implantation methods, thermal or plasma oxidation or nitridation methods, chemical vapor deposition methods and physical vapor deposition methods. The BOX layer 104 may include a thickness ranging from approximately 10 nm to approximately 80 nm. In one embodiment, the BOX layer 104 may be approximately 20 nm thick.

The SOI layer 106 may include any of the several semiconductor materials included in the base substrate 102. In general, the base substrate 102 and the SOI layer 106 may include either identical or different semiconducting materials with respect to chemical composition, dopant concentration and crystallographic orientation. The SOI layer 106 includes a thickness ranging from approximately 3 nm to approximately 20 nm. While an ETSOI substrate is depicted, embodiments of the present invention may also typical SOI substrates, where SOI layer 106 may have a thickness of up to approximately 100 nm. Methods for forming the SOI layer 106 are well known in the art. Non-limiting examples include SIMOX (Separation by Implantation of Oxygen), wafer bonding, and ELTRAN® (Epitaxial Layer TRANsfer).

Figure 2:
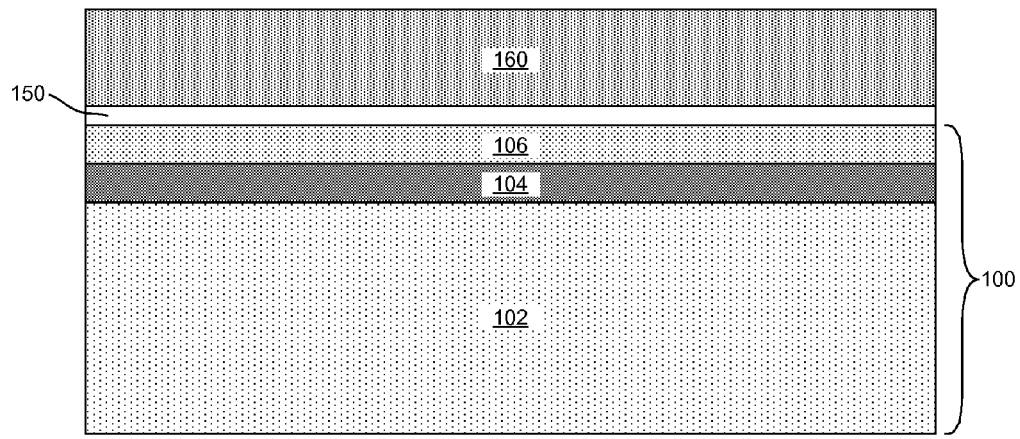
FIG. 2 depicts forming a pad oxide and a pad nitride layer above the ETSOI substrate, according to an embodiment of the present invention.

Referring to FIG. 2, a pad oxide layer 150 and a pad nitride layer 160 may be formed above substrate 100. The pad oxide layer 150 may be made of, for example, silicon oxide or silicon oxynitrides. In one embodiment, the pad oxide layer 150 can be formed, for example, by thermal or plasma conversion of a top surface of the SOI layer 106. In other embodiments, the pad oxide layer 150 can be formed by deposition of silicon oxide or silicon oxynitride by known deposition techniques, including, for example, chemical vapor deposition (CVD) or atomic layer deposition (ALD). The oxide layer may have a thickness of approximately 1 nm to approximately 20 nm. In one embodiment, the pad oxide layer 150 may be approximately 5 nm thick.

The pad nitride layer 160 may include an insulating material such as, for example, silicon nitride. The pad nitride layer 160 may be formed using known deposition techniques, including, for example, ALD and CVD. In one embodiment, the pad nitride layer 160 may have a thickness ranging from approximately 50 nm to approximately 100 nm. In one embodiment, the pad nitride layer 160 may be approximately 80 nm thick.

Figure 3:
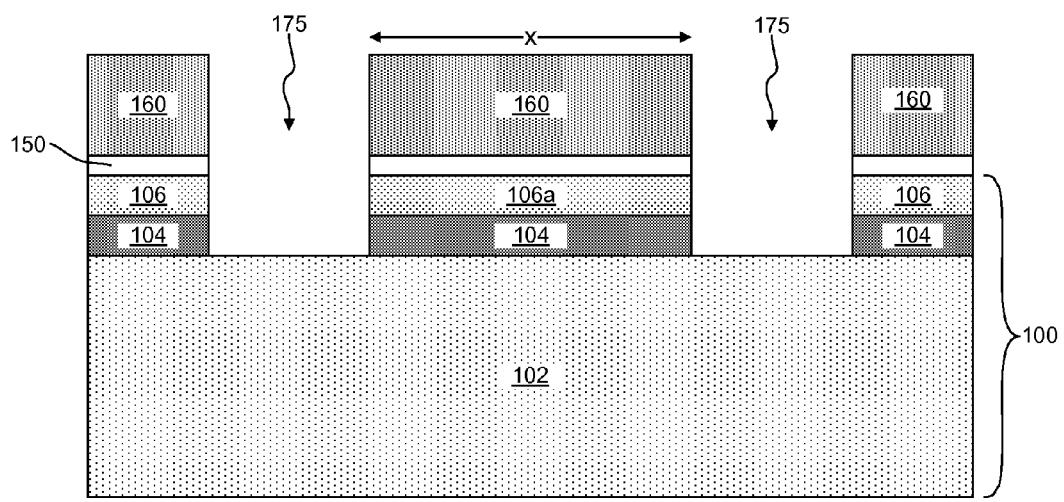
FIG. 3 depicts forming isolation recess regions in the semiconductor-on-insulator (SOI) layer and buried oxide (BOX) layer of the ETSOI substrate, according to an embodiment of the present invention.

Referring to FIG. 3, isolation recess regions 175 may be formed in the BOX layer 104, the SOI layer 106, the pad oxide layer 150, and the pad nitride layer 160. The isolation recess regions 175 may be formed using known anisotropic etching techniques, including, for example, reactive ion etching (RIE) or plasma etching. The isolation recess regions 175 may have a horizontal width of approximately 20 nm to approximately 100 nm. In one embodiment, the isolation recess regions 175 may have a horizontal width of approximately 40 nm. The isolation recess regions 175 may be separated by a horizontal distance x, where x may range from approximately 60 nm to approximately 200 nm. In one embodiment, x may be approximately 100 nm. Formation of the isolation recess regions 175 may define a channel region 106a in the SOI layer 106. The remaining portions of the SOI layer 106 may form, for example, channel regions of adjacent devices.

Figure 4A:
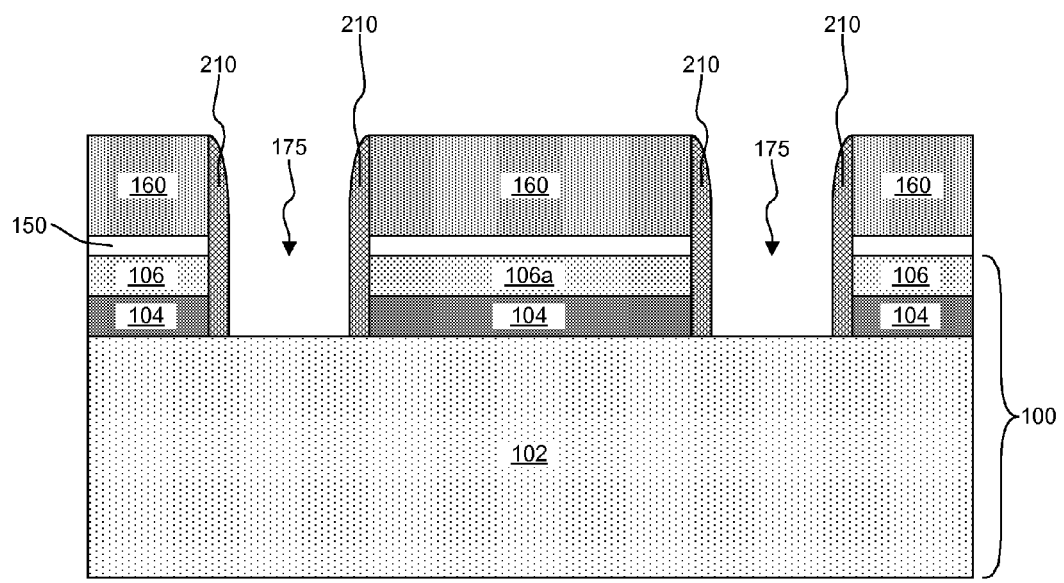
FIG. 4A depicts forming spacers on the sidewalls of the isolation recess regions, according to an embodiment of the present invention.
Figure 4B:
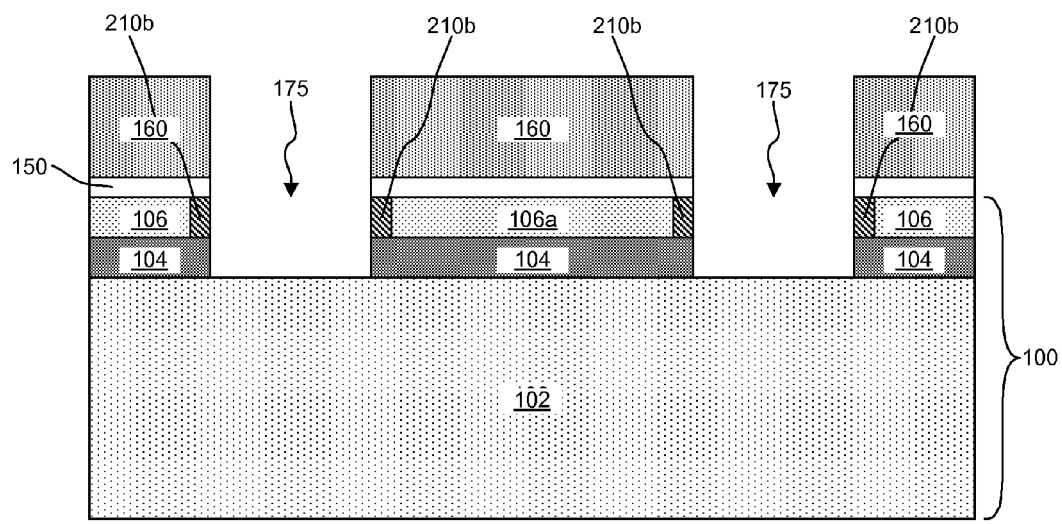
FIG. 4B depicts implanting oxidation inhibiting species in regions of the SOI layer adjacent to the isolation recess regions, according to an embodiment of the invention.

FIGS. 4A-4B depict methods of preventing oxidation of the channel region 106a in the isolation recess regions 175. Referring to FIG. 4A, the spacers 210 may be formed on the sidewalls of the isolation recess regions 175. The spacers may have a horizontal thickness of approximately 2 nm to approximately 10 nm. In one embodiment, the spacers may be approximately 5 nm. The spacers 210 may be formed by depositing a silicon nitride layer using known deposition techniques, including, for example, ALD and CVD, and then etching the silicon nitride layer to remove excess material.

Referring to FIG. 4B, rather than forming the spacers 210, oxidation inhibited regions 210b may be formed on the exposed portions of the SOI layer 106 to prevent oxidation of the channel region 106a. The oxidation inhibited regions 210b may have a horizontal thickness of approximately 3 nm to approximately 10 nm. The oxidation inhibited regions 210b may be formed by implanting oxidation inhibiting species such as, for example, nitrogen in the exposed portions of the SOI layer 106. For example, in one embodiment, the pad nitride layer 160 has a thickness of approximately 80 nm, the pad oxide layer 150 has a thickness of approximately 5 nm, the SOI layer 106 has a thickness of approximately 10 nm, and the isolation recess regions 175 have a horizontal width of approximately 40 nm. In such an embodiment, oxidation inhibited regions 210b with a horizontal thickness of approximately 7 nm to approximately 8 nm may be formed using a nitrogen implant process at an approximately 20 degree to approximately 30 degree angle with a dose of approximately $3 \times 10^{14}/cm^2$ to approximately $3 \times 10^{15}/cm^2$ and an energy of approximately 3 keV to approximately 5 keV.

In some embodiments, formation of the oxidation inhibited regions 210b (FIG. 4B) may require less process steps than formation of the spacers 210a (FIG. 4A) and may therefore be desirable. However, formation of the oxidation inhibited regions 210b includes the risk that the oxidation inhibiting species may migrate further into channel region 106a than desired, particularly if subsequent high-temperature processing steps may be performed. A person of ordinary skill in the art may be able to determine which process is most appropriate for a given process flow. The following paragraphs, however, describe subsequent processes following only the formation of the spacers 210 in order to mitigate the oxidation of the exposed portions of the SOI layer 106. A person of ordinary skill in the art will be able to adapt the processes described in FIGS. 5-9 to include oxidation inhibited regions 210b.

Figure 5:
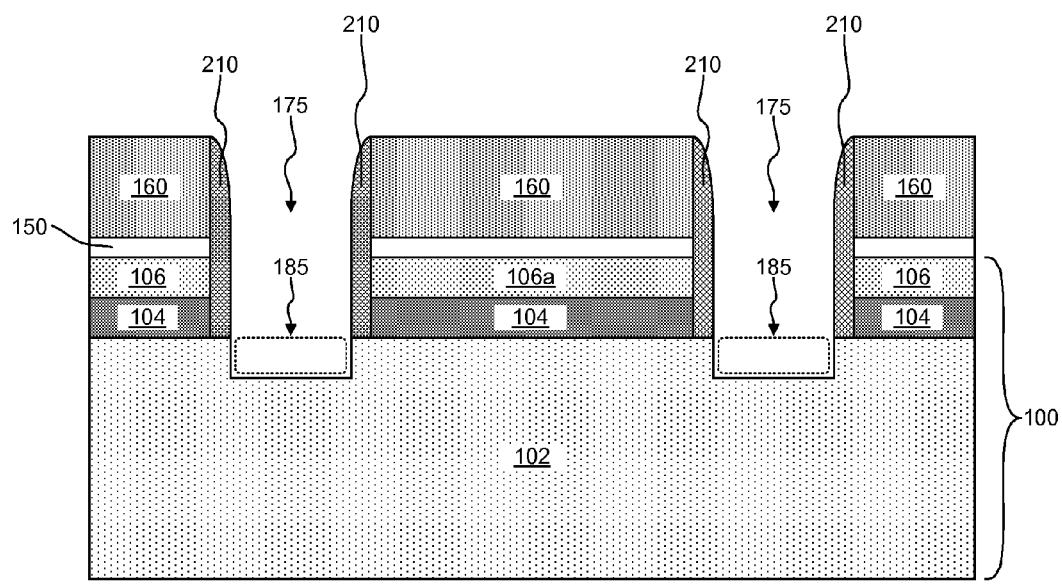
FIG. 5 depicts deepening the isolation recess regions into the base substrate layer of the ETSOI substrate, according to an embodiment of the present invention.

Referring to FIG. 5, the isolation recess regions 175 may be deepened into the base substrate 102 by removing the portions 185 from the base substrate 102. The portions 185 may have a depth of up to approximately 15 nm. In one embodiment, portions 185 may have a depth of approximately 10 nm. In some other embodiments, the process of deepening the isolation recess regions 175 may not be performed. The portions 185 from the base substrate 102 may be removed using any known anisotropic etching process capable of selectively removing material from the base substrate 102 without substantially removing material from the pad nitride layer 160.

Figure 6:
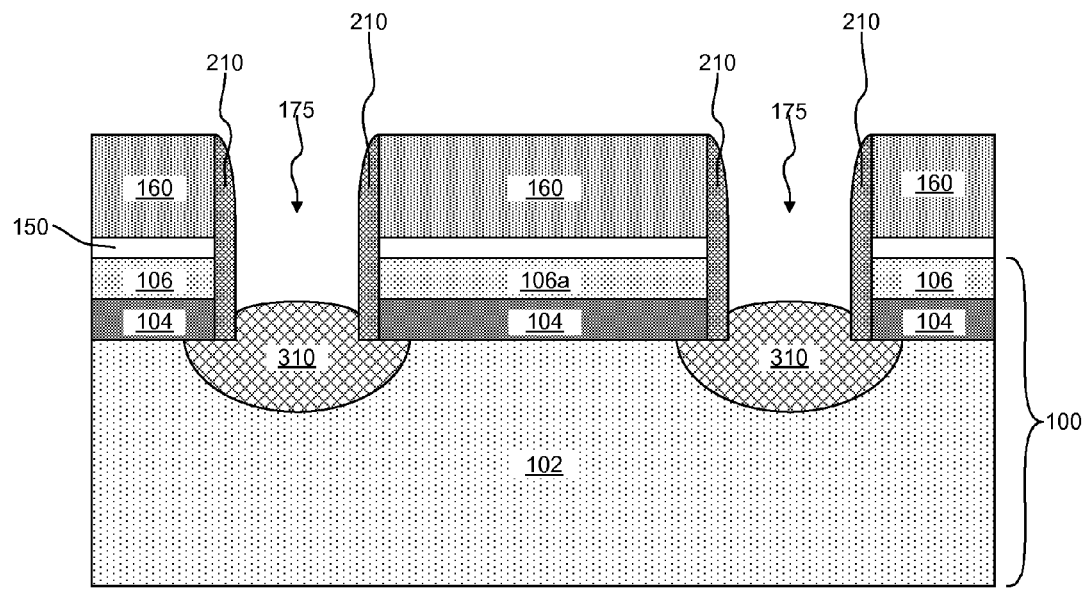
FIG. 6 depicts forming oxide regions in bottom portions of the isolation recess regions, according to an embodiment of the present invention.

Referring to FIG. 6, oxide regions 310 may be formed in bottom portions of the isolation recess regions 175 (FIG. 5). The oxide regions 310 may extend into the base substrate 102 at a depth of approximately 10 nm to approximately 70 nm below the top surface of the base substrate 102. The top surfaces of the oxide regions 310 may extend vertically to at least the top surface of the BOX layer 104. In some embodiments it may be desirable for the top surfaces of the oxide regions 310 to be above the top surface of the BOX layer 104 to account for potential etching of the oxide regions 310 in subsequent processing steps.

The oxide regions 310 may be formed by a thermal oxidation process such as LOCOS (LOCal Oxidation Of Silicon). The LOCOS process consists of exposing the base substrate 102 to an oxidation cycle wherein the base substrate 102 is placed in an oxidizing atmosphere at an elevated temperature between approximately 970 degrees Celsius and approximately 1100 degrees C. in the presence of water vapor to produce silicon dioxide in the isolation recess regions 175. During the LOCOS process, the silicon dioxide extends downward into the base substrate 102. This process may be carried out for a period sufficient so that the top surfaces of oxide regions 310 is essentially coplanar with or above the top surface of the top BOX layer.

Because the thermal oxidation process may result in a volumetric expansion, formation of oxide regions 310 may apply compressive strain to the channel region 106a. By removing the portions 185 (FIG. 5) from the base substrate 102 prior to forming the oxide regions 310, the well-known 'bird's beak' problem associated with the LOCOS process, which may result in concentration of stress in undesirable directions, may be alleviated, resulting in greater transfer of stress to the channel region 106a.

Figure 7:
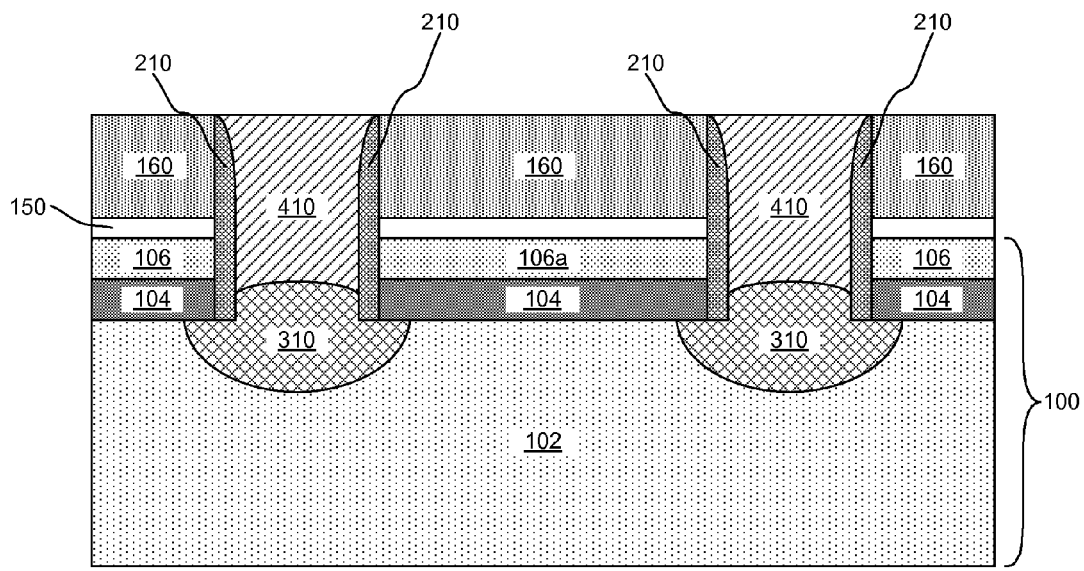
FIG. 7 depicts forming isolation regions in top portions of the isolation recess regions, according to an embodiment of the present invention.

Referring to FIG. 7, isolation structures 410 may be formed in the isolation recess regions 175 (FIG. 6) above oxide regions 310. In one embodiment, the isolation structures 410 may be formed by filling the unfilled portions of the isolation recess regions 175 with an insulating material, including, for example, silicon oxide using known depositions techniques, including, for example, chemical vapor deposition (CVD) or atomic layer deposition (ALD). Following deposition of the insulating material, a planarization process, such as, for example chemical-mechanical planarization (CMP) may be performed to remove excess insulating material that may have overfilled the isolation recess regions 175.

Figure 8:
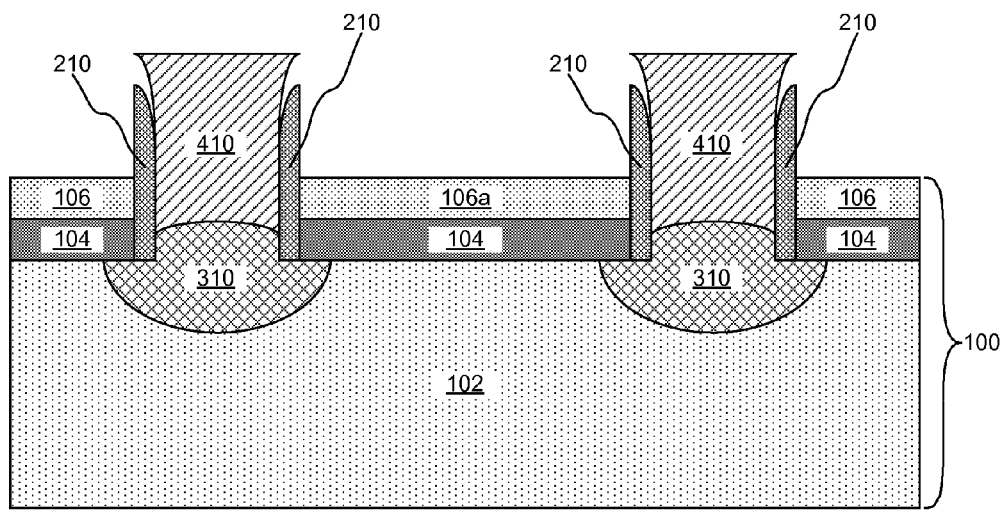
FIG. 8 depicts removing the pad oxide and the pad nitride layer from above the ETSOI substrate, according to an embodiment of the present invention.

Referring to FIG. 8, the pad oxide layer 150 (FIG. 7) and the pad nitride layer 160 (FIG. 7) may be removed from above the SOI layer 106 to expose the channel region 106a. The pad oxide layer 150 and the pad nitride layer 160 may be removed by any known wet or dry etching process capable of selectively removing oxide and nitride, respectively, without substantially removing the semiconductor material of the SOI layer 106. Because the spacers 210 may be made of nitride and the isolation structures 410 may be made of oxide, some material may be removed from the spacers 210 and the isolation structures 410 during removal of the pad oxide layer 150 and the pad nitride layer 160.

Figure 9:
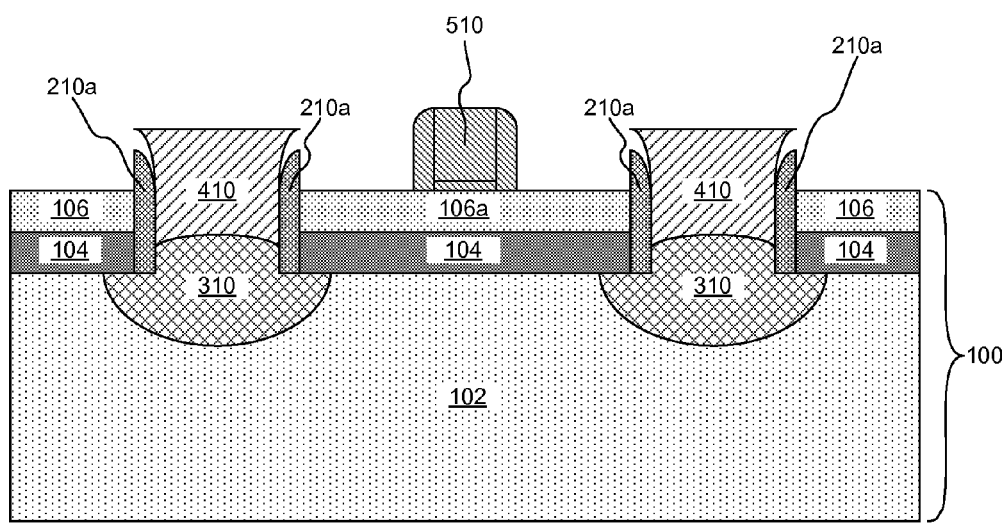
FIG. 9 depicts forming a gate structure on the SOI layer, according to an embodiment of the present invention.

Referring to FIG. 9, a gate structure 510 may be formed above channel region 106a. The gate structure 510 may be formed using any known processes including gate-first and gate-last processes. In a gate-first processes, a stack of layers, possibly including a gate dielectric layer, work-function metal layers, and a gate electrode layer, may be deposited above the channel region 106a and then etched to form a gate. Spacers may then be formed on sidewalls of the gate. Source/drain regions may then be formed in the channel region 106a laterally separated from the gate by the spacers by, for example, dopant implantation.

In a gate-last process, a dummy gate may first be formed above the channel region 106a by depositing a layer of sacrificial material, for example, polysilicon, and etching the layer to remove excess material. Spacers may then be formed on sidewalls of the gate. Source/drain regions may then be formed in the channel region 106a laterally separated from the gate by the spacers by, for example, dopant implantation. Subsequently, the dummy gate may be removed from between the spacers to form a recess region. The recess region may then be filled by a replacement gate, possibly including a gate dielectric, work-function metals, and a semiconductor electrode or metal electrode.

While forming the gate structure 510, by the gate-first or gate-last methods described above, or by some other method, portions of spacers 210a and/or isolation structures 410 may be removed by etching processes required to form the gate structure 510. In some embodiments, it may be desirable for portions of the spacers 210a and portions of the isolation structures 410 to remain above the top surface of the BOX layer 104. Therefore, it may be necessary to form the spacers 210a and the isolation structures 410 to be larger than ultimately desired to account for etching during formation of the gate structure 510. Following formation of the gate structure 510, further processing steps may be performed to complete forming a transistor structure above the channel region 106a, including, for example, forming source/drain regions and contacts. These processes are well-known in the art.

It should be noted that, while the processes described in conjunction with FIG. 9 result in the formation a FET on channel region 106a, a person of ordinary skill in the art will understand that a strained ETSOI channel such as channel region 106a may have many other applications beyond FETs.

It is frequently common in microelectronic structures to have pFETs (i.e., FETs with p-type channel regions) formed adjacent to both other pFETs and nFETs (i.e., FETs with p-type channel regions) Because the isolation process described above in conjunction with FIGS. 1-9, and in particular FIG. 6, applies compressive strain to the substrate, it may only be appropriate for pFETs, which may benefit from compressive strain, and not for nFETs, where compressive strain may decrease performance. Subsequently, the isolation process described above should only be used to isolate pFETs from adjacent pFETs, and not to isolate nFETs from adjacent nFETs or adjacent pFETs.

Figure 10:
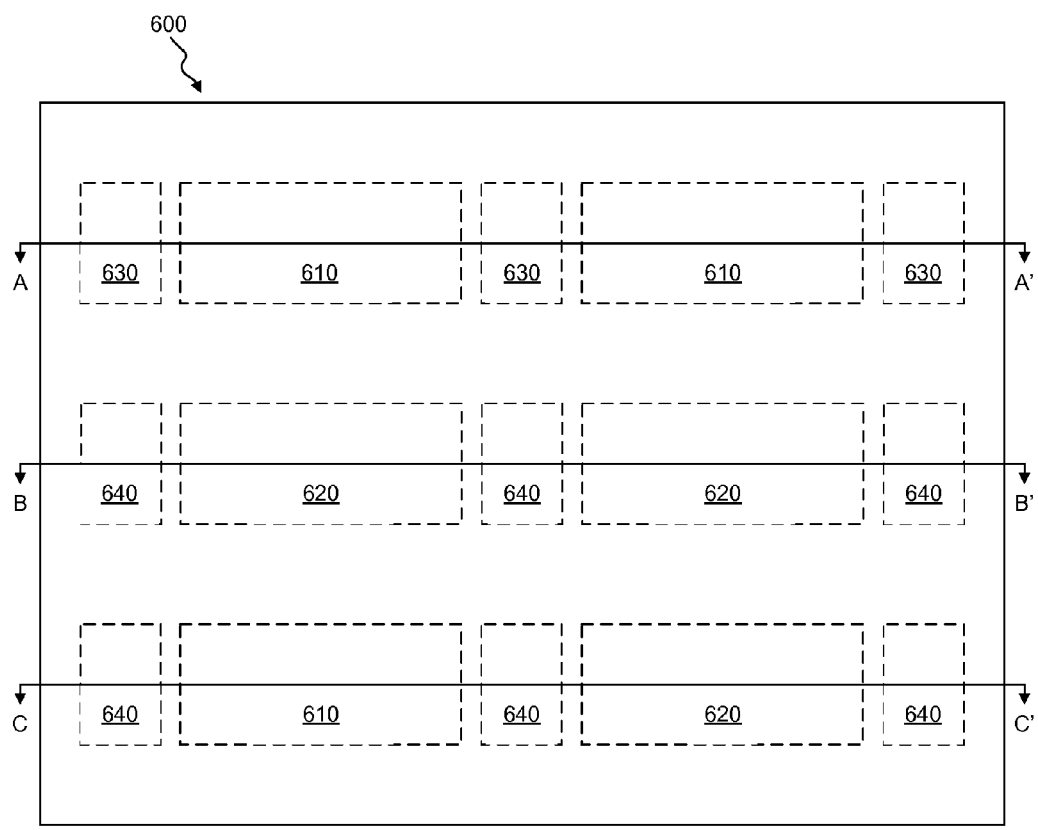
FIG. 10 depicts a wafer containing a plurality of pFET regions, nFET regions, and isolation regions, according to an embodiment of the present invention.

Referring to FIG. 10, it may be desired to form a plurality of pFETs in pFET regions 610 and a plurality of nFETs in nFET regions 620. Because, as discussed above, pFETs benefit from compressive stress while nFETs do not, it may be desirable to employ the process described above in conjunction with FIGS. 1-9 to form straining isolation structures in isolation regions 630, between two adjacent pFET regions 610, while forming non-straining isolation structures, such as traditional STI isolation, in isolation regions 640 between either two nFET regions 620 or an nFET region 620 and a pFET region 610. The following paragraphs describe, in conjunction with FIGS. 11-20, embodiments including such straining and non-straining isolation structures. Each of FIGS. 11-20 includes cross section views of the wafer 600 along lines A-A' and B-B'. It will be understood by a person of ordinary skill in the art that cross-sections along line C-C' would be essentially identical to line B-B' and are therefore not included.

Figure 11:
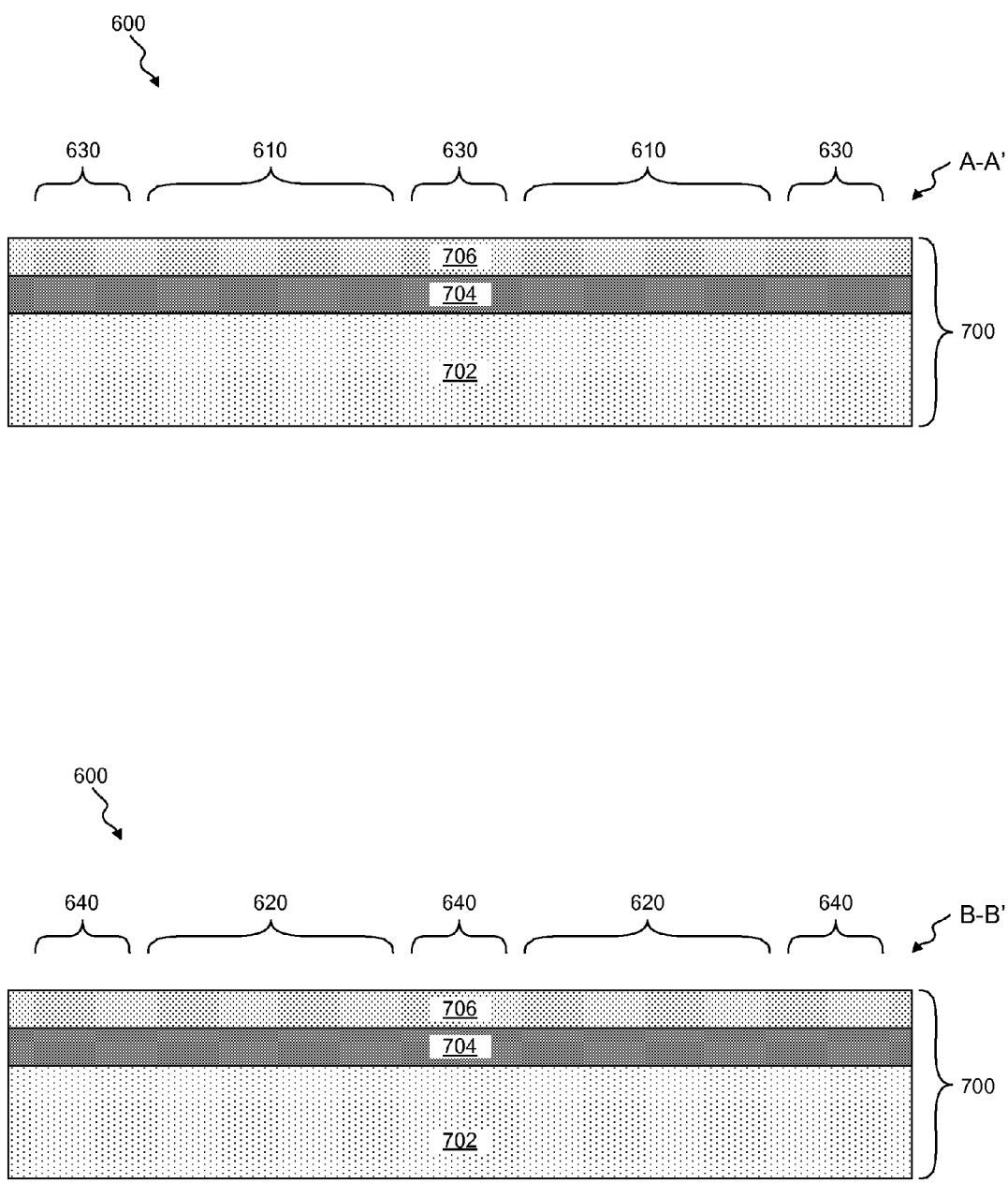
FIG. 11 depicts an extremely-thin semiconductor-on-insulator (ETSOI) substrate, according to an embodiment of the present invention

Referring to FIG. 11, the wafer 600 may include an extremely-thin semiconductor-on-insulator (ETSOI) substrate 700. The substrate 700 may include a base substrate 702, a BOX layer 704, and a SOI layer 706. The base substrate 702, the BOX layer 704, and the SOI layer 706 may be made of the same materials and have the same dimensions as the base substrate 102 (FIG. 1), the BOX layer 104 (FIG. 1), and the SOI layer 106 (FIG. 1), respectively.

Figure 12:
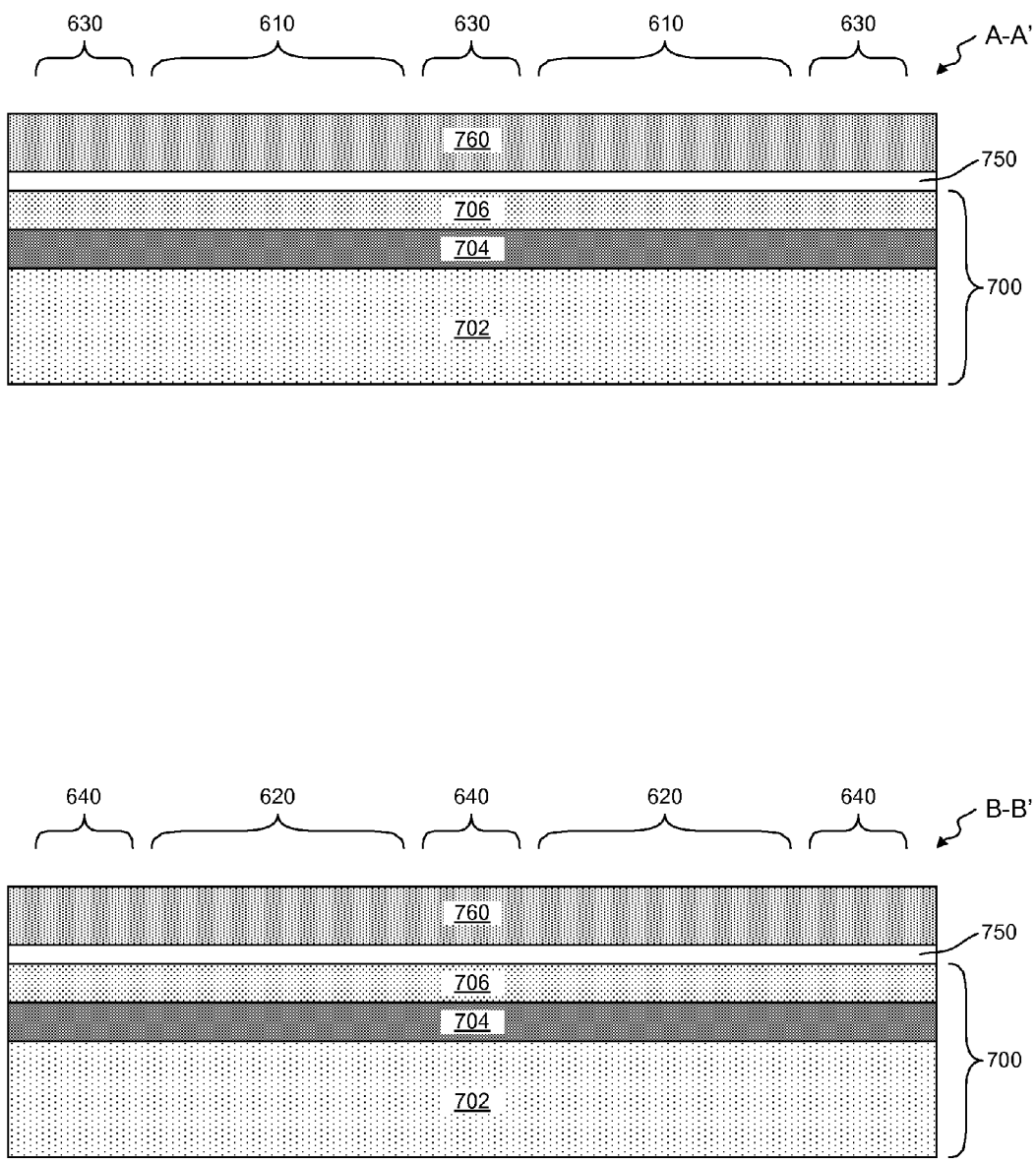
FIG. 12 depicts forming a pad oxide and a pad nitride layer above the ETSOI substrate of FIG. 11, according to an embodiment of the present invention

Referring to FIG. 12, a pad oxide layer 750 and a pad nitride layer 760 may be formed above substrate 700. The pad oxide layer 750 and the pad nitride layer 760 may be made of the same materials, have the same dimensions as, and be formed by the same methods as the pad oxide layer 150 (FIG. 2) and pad nitride layer 160 (FIG. 2), respectively.

Figure 13:
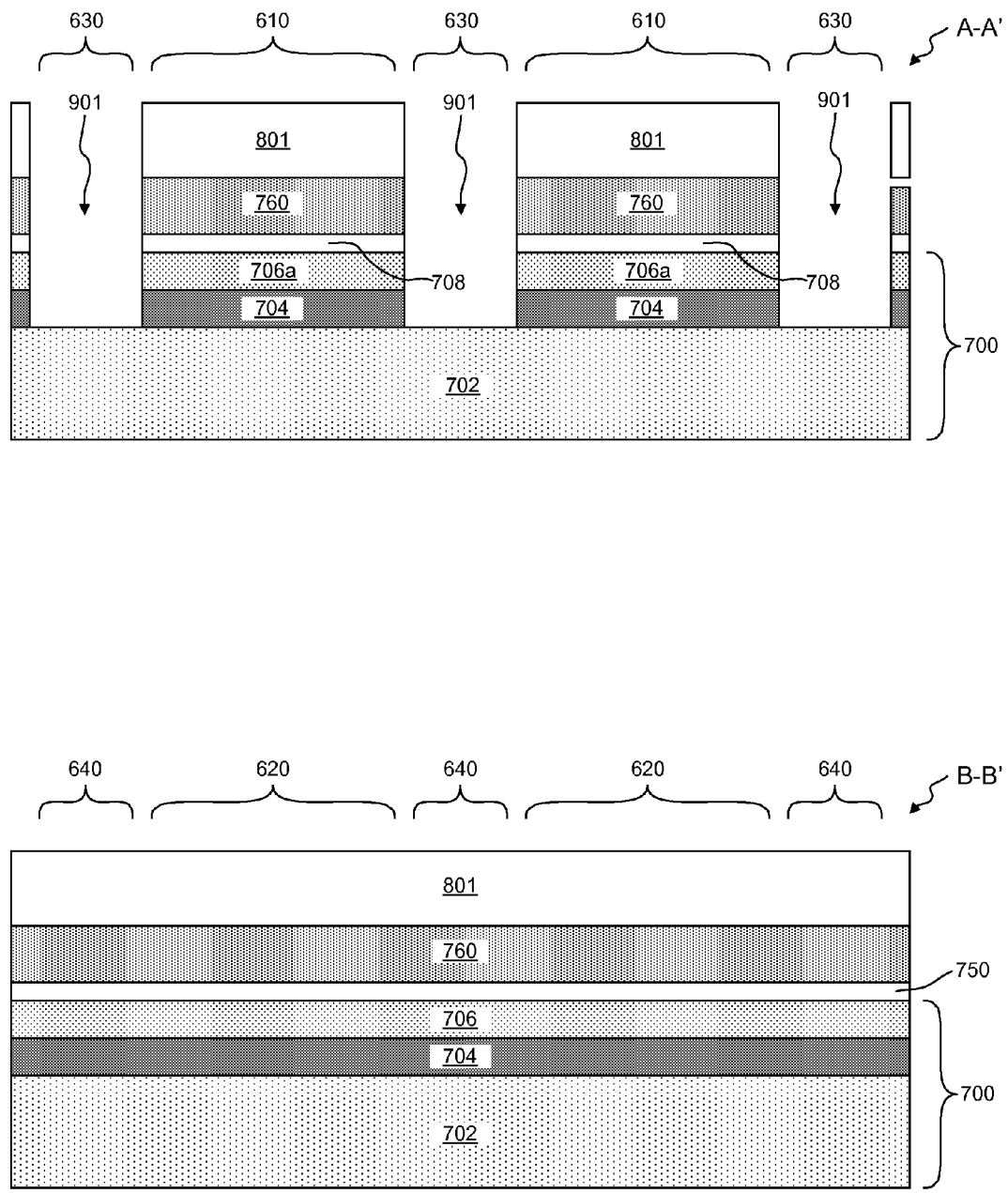
FIG. 13 depicts forming isolation recess regions between adjacent pFET regions of the structure of FIG. 12, according to an embodiment of the present invention

Referring to FIG. 13, a first photoresist layer 801 may be formed above the pad nitride layer 760 and developed so that portions of the pad nitride layer 760 in isolation regions 630 are exposed, but the rest of the pad nitride layer, particularly isolation regions 620, remain covered. Isolation recess regions 901 may then be formed by etching the pad nitride layer 760, the pad oxide layer 750, the SOI layer 706, and the BOX layer 704. Formation of the isolation recess regions 901 may define channel regions 706a in the SOI layer 706 in the pFET regions 610 along line A-A'.

Figure 14:
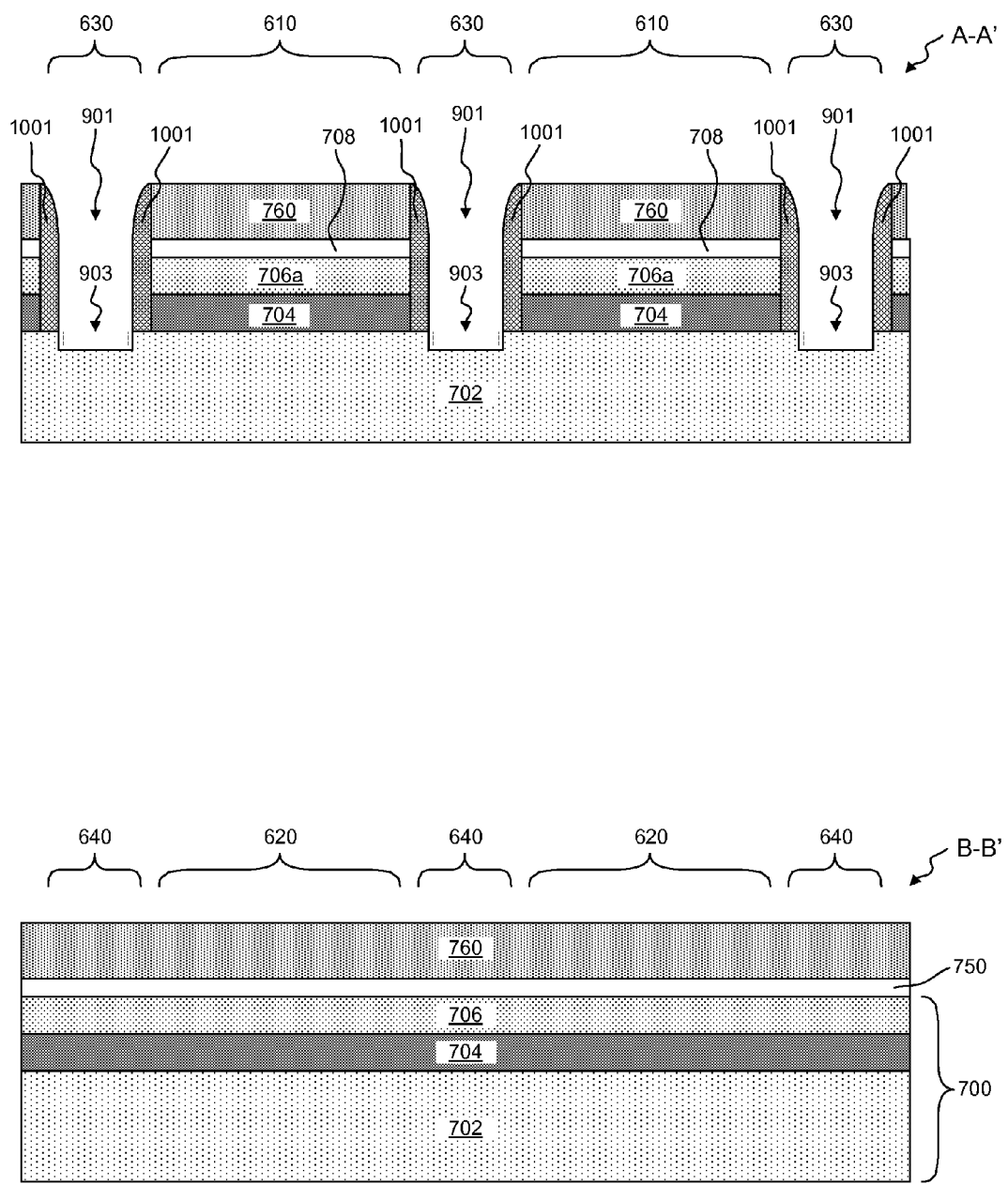
FIG. 14 depicts forming spacers on sidewalls of the isolation recess regions of FIG. 13 and deepening the isolation recess regions, according to an embodiment of the present invention.

Referring to FIG. 14, the first photoresist layer 801 may be removed and spacers 1001 may be formed in isolation recess regions 901. Spacers 1001 may be made of the same materials, have the same dimensions as, and be formed by the same methods as the spacers 210 (FIG. 4A). Alternatively, oxidation inhibited regions (not shown) may be formed in the ends of channel regions 706a, as discussed above in conjunction with FIG. 4B. After forming spacers 1001, isolation recess regions 901 may be deepened by removing portions 903 from the base substrate 702

Figure 15:
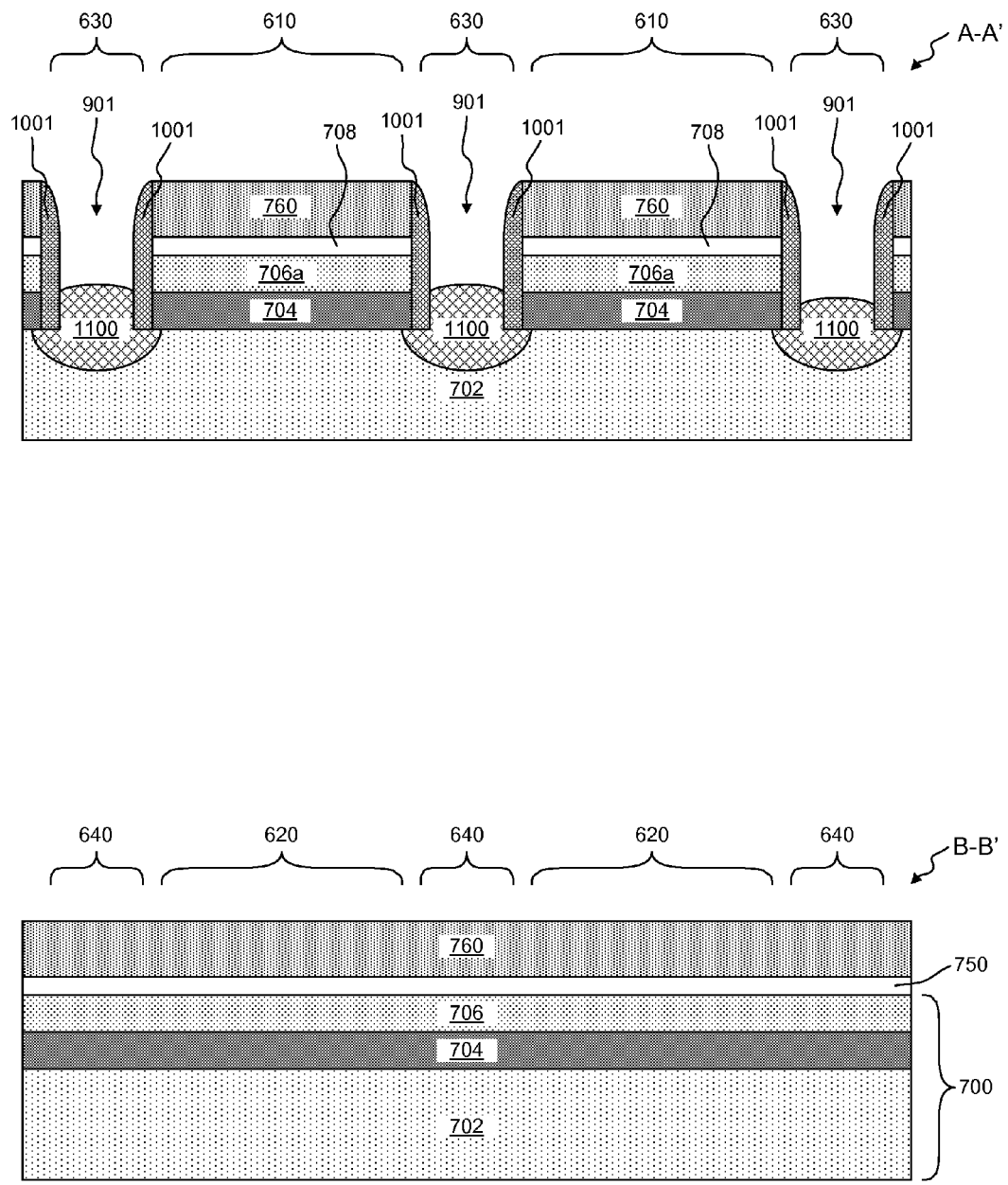
FIG. 15 depicts forming oxide regions in the bottom of the isolation recess regions of FIG. 14, according to an embodiment of the present invention.

Referring to FIG. 15, oxide regions 1100 may be formed in bottom portions of the isolation recess regions 901. The oxide regions 1100 may be made of the same materials, have the same dimensions as, and be formed by the same methods as the oxide regions 330.

Figure 16:
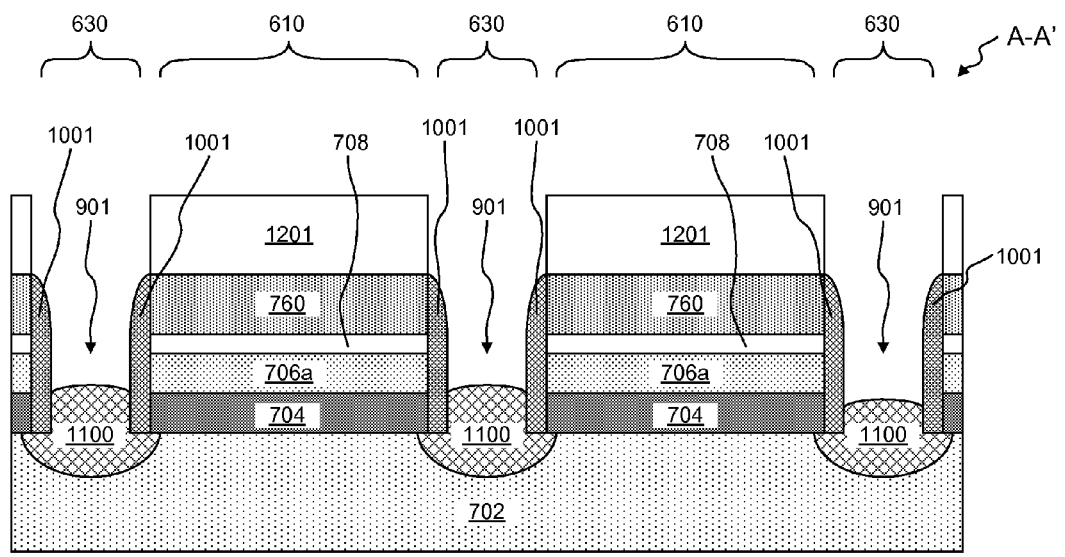
FIG. 16 depicts forming isolation recess regions between adjacent nFET regions of the structure of FIG. 15, according to an embodiment of the present invention
Figure 16:
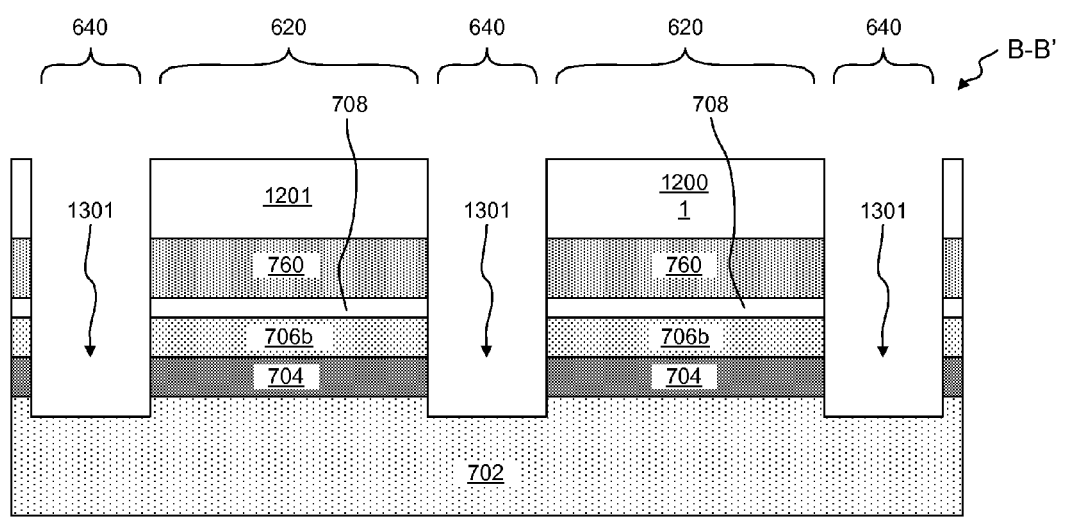

Referring to FIG. 16, a second photoresist layer 1201 may be formed and developed so that portions of the pad nitride layer 760 in isolation regions 640 are exposed. In some embodiments, the second photoresist layer 1201 may also expose the isolation recess regions 901. Isolation recess regions 1301 may then be formed in the isolation regions 640 by etching the pad nitride layer 760, the pad oxide layer 750, the SOI layer 706, and the BOX layer 704. Formation of the isolation recess regions 1301 may define channel regions 706b in the SOI layer 706 in the nFET regions 620 along line B-B'. Because the channel regions 706b are not formed adjacent to the oxide regions 1100, the channel regions 706 will be unstressed and may form part of either pFETs or nFETs.

Figure 17:
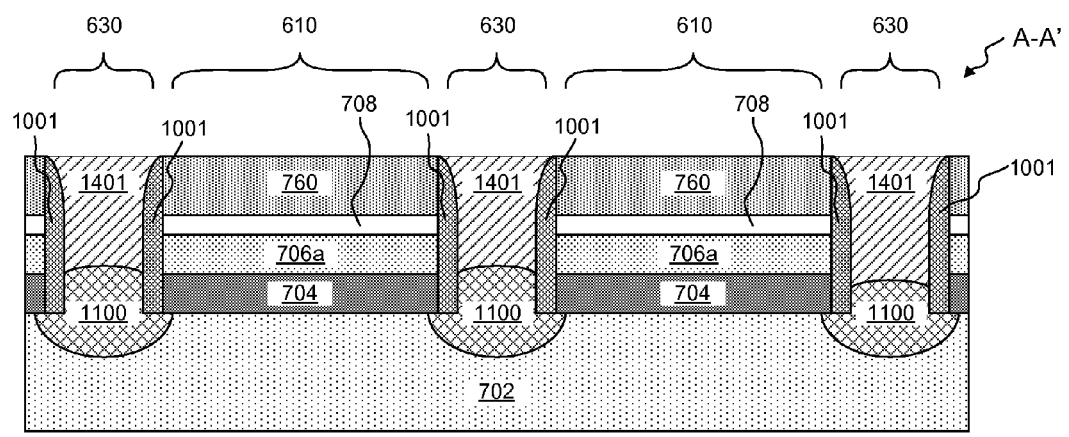
FIG. 17 depicts filling the isolation recess regions of FIG. 16 with an insulating material, according to an embodiment of the present invention.
Figure 17:
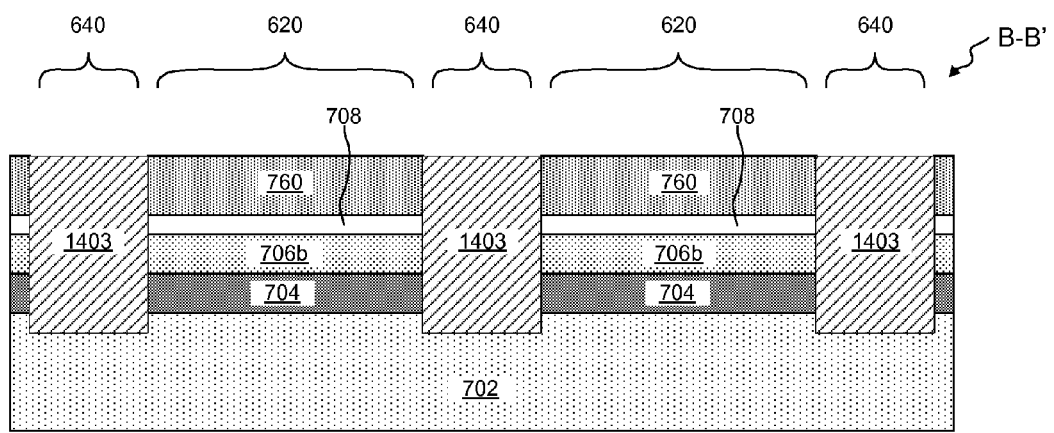

Referring to FIG. 17, insulator regions 1401 and 1403 may be formed in isolation regions 630 and 640 by filling the unfilled portions of the isolation recess regions 901 and 1301 (FIG. 16) with an insulating material, including, for example, silicon oxide. Following deposition of the insulating material, a planarization process, such as, for example, CMP may be performed to remove excess insulating material that may have overfilled the isolation recess regions 901 and 1301.

Figure 18:
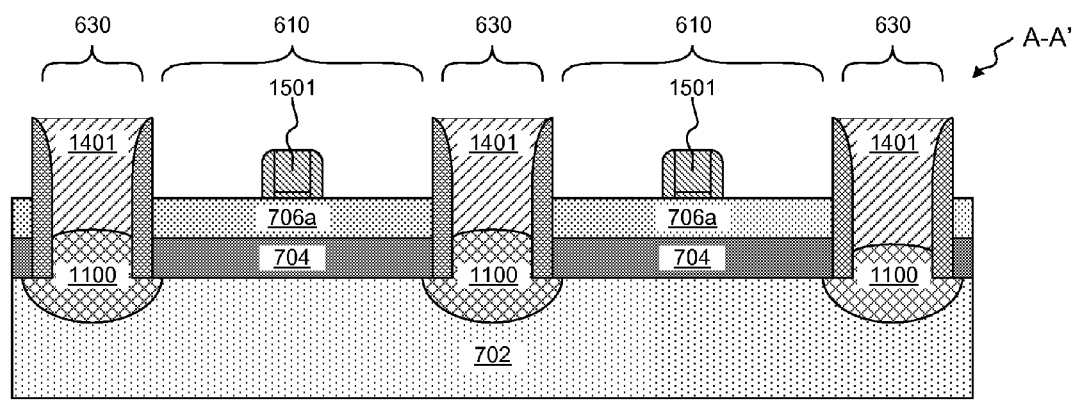
FIG. 18 depicts removing the pad oxide and pad nitride layers and forming gate structures above channel regions of the structure of FIG. 17, according to an embodiment of the present invention.
Figure 18:
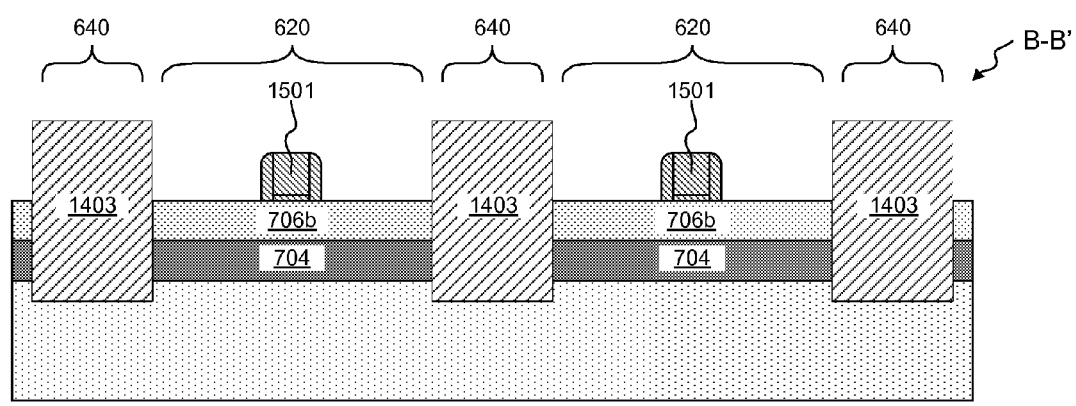

Referring to FIG. 18, the pad oxide layer 750 and the pad nitride layer 760 may be removed from above substrate 700 and gates 1501 may be formed above the channel regions 706a and 706b. The gates 1501 may be made of the same materials, have the same dimensions as, and be formed by the same methods as the gate 501. It will be understood that the gates 1501 may vary in composition depending on if they are formed in a pFET region 610 or an nFET region 620. Following formation of the gate structures 510, further processing steps may be formed to complete forming a transistor structures and above the channel region 106a, including forming source/drain regions and contacts. These processes are well-known in the art.

Figure 19:
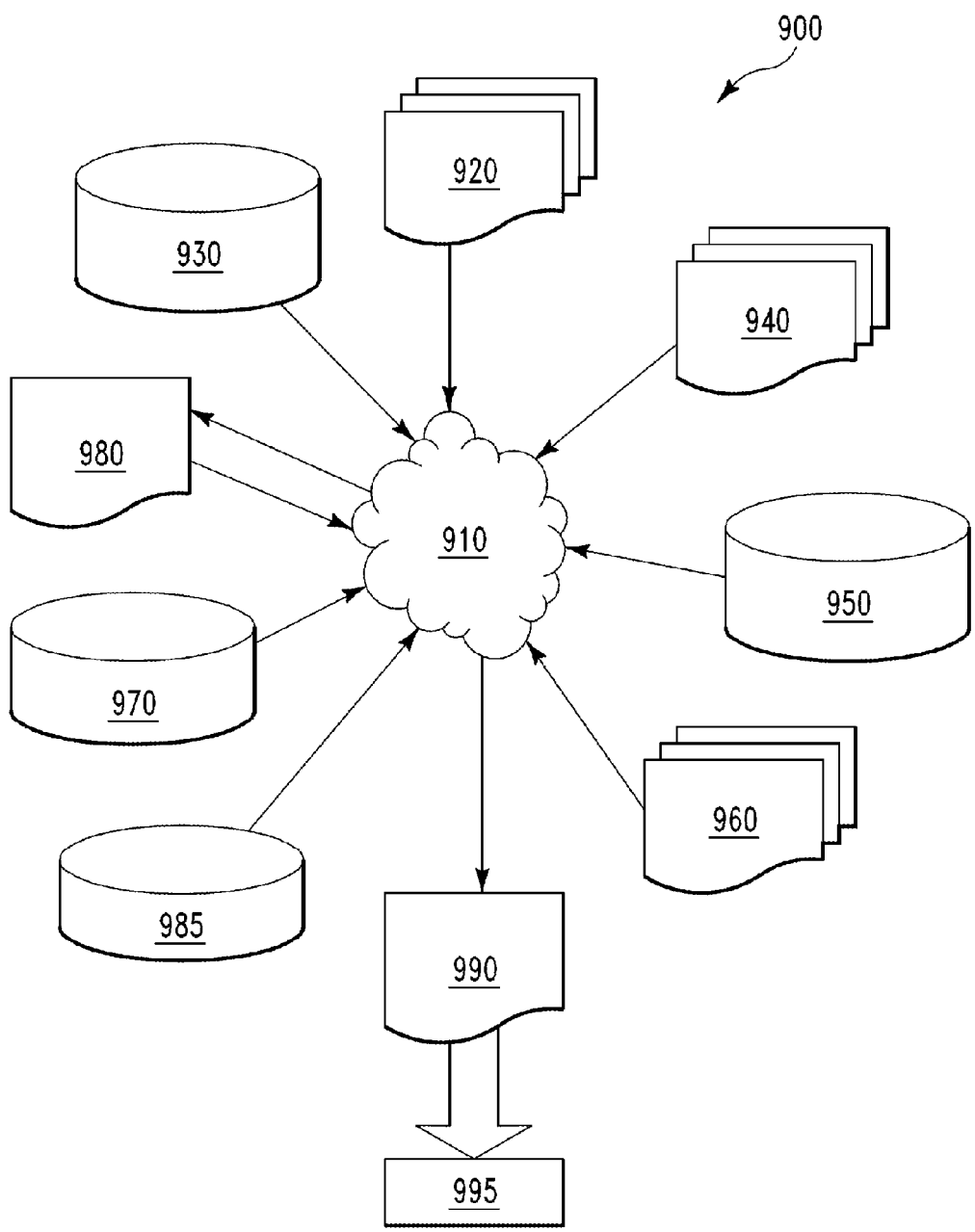
FIG. 19 depicts a flow diagram of a design process used in semiconductor design, manufacture, and/or test.

Referring to FIG. 19, illustrates multiple such design structures including an input design structure 920 that is preferably processed by a design process 910. In one embodiment, the design structure 920 comprises design data used in a design process and comprising information describing one or more embodiments of the invention with respect to the structures as shown in FIG. 9 and FIG. 18. The design data in the form of schematics or HDL, a hardware-description language (e.g., Verilog, VHDL, C, etc.) may be embodied on one or more machine readable media. For example, design structure 920 may be a text file, numerical data or a graphical representation of the one or more embodiments of the invention, as shown in FIG. 9 and FIG. 18. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 9 and FIG. 18. As such, design structure 920 may comprise files or other data structures including human and/or machine-readable source code, compiled structures, and computer-executable code structures that when processed by a design or simulation data processing system functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 9 and FIG. 18 to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 9 and FIG. 18. In one embodiment, design structure 990 may comprise a compiled, executable HDL simulation model that functionally simulates the devices shown in FIG. 9 and FIG. 18.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce the device or structure as described above and shown in FIG. 9 and FIG. 18. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a strained channel region in a semiconductor-on-insulator (SOI) substrate including a buried insulator (BOX) layer above a base substrate layer and a SOI layer above the BOX layer, the method comprising:
   etching the SOI layer and the BOX layer to form a first isolation recess region and a second isolation recess region, wherein a portion of the SOI layer between the first and the second isolation recess regions defines a channel region in the SOI layer; and
   oxidizing a portion of the base substrate layer below the first and the second isolation regions to form a first oxide region and a second oxide region, wherein the first and the second oxide regions apply compressive strain to the channel region.

2. The method of claim 1, wherein the SOI layer has a thickness of approximately 3 nm to approximately 20 nm and the BOX layer has a thickness of approximately 10 nm to approximately 80 nm.

3. The method of claim 1, further comprising protecting the channel region from oxidation prior to oxidizing the portion of the base substrate layer.

4. The method of claim 3, wherein protecting the channel region from oxidation comprises forming spacers on sidewalls of the first isolation recess region and on sidewalls of the second isolation recess region.

5. The method of claim 3, wherein protecting the channel region from oxidation comprises implanting an oxidation-inhibiting species into a first end of the channel region adjacent to the first isolation recess region and a second end of the channel region adjacent to the second isolation recess region.

6. The method of claim 1, wherein oxidizing the portion of the base substrate layer comprises a thermal oxidation process.

7. The method of claim 6, wherein the thermal oxidation process comprises a Local Oxidation of Silicon (LOCOS) process.

8. The method of claim 1, further comprising deepening the first isolation recess region into the base substrate and deepening the second isolation recess region into the base substrate prior to oxidizing a portion of the base substrate layer.

9. The method of claim 1, further comprising:
   forming a first isolation region above the first oxide region, wherein a top surface of the first isolation region is coplanar with or above a bottom surface of the pad nitride layer; and
   forming a second isolation region above the second oxide region, wherein a top surface of the first isolation region is coplanar with or above a bottom surface of the pad nitride layer.

10. The method of claim 9, wherein forming a first isolation region above the first oxide region and forming a second isolation region above the second oxide region comprises filling the first isolation recess region and the second isolation recess region with an insulating material.

* * * * *